United States Patent
Georgii

(10) Patent No.: US 7,211,343 B2
(45) Date of Patent: May 1, 2007

(54) FUEL CELL SYSTEM AND METHOD FOR VOLTAGE MONITORING FOR A FUEL CELL SYSTEM

(75) Inventor: Martin Georgii, Stuttgart (DE)

(73) Assignee: DaimlerChrysler AG, Stuttgart (DE)

( * ) Notice: Subject to any disclaimer, the term of this patent is extended or adjusted under 35 U.S.C. 154(b) by 608 days.

(21) Appl. No.: 10/422,899

(22) Filed: Apr. 25, 2003

(65) Prior Publication Data

US 2003/0228503 A1    Dec. 11, 2003

(30) Foreign Application Priority Data

Apr. 26, 2002    (DE)    ................................ 102 18 669

(51) Int. Cl.
*H01M 8/00*    (2006.01)
(52) U.S. Cl. .............................. 429/13; 429/17; 429/23
(58) Field of Classification Search .................. 429/13, 429/17, 23
See application file for complete search history.

(56) References Cited

FOREIGN PATENT DOCUMENTS

| | | |
|---|---|---|
| DE | 19523260 | 3/1997 |
| DE | 19827880 | 12/1999 |
| DE | 10055291 | 5/2001 |
| DE | 19954306 | 7/2001 |
| EP | 0 744 314 B1 | 11/1996 |
| EP | 0 980 134 A1 | 2/2000 |
| JP | 09-046821 | 2/1997 |
| JP | 11-144749 | 5/1999 |
| JP | 2000-089762 | 3/2000 |

OTHER PUBLICATIONS

German Office Action dated Dec. 21, 2005.

*Primary Examiner*—Bruce F. Bell
(74) *Attorney, Agent, or Firm*—Crowell & Moring LLP

(57) ABSTRACT

A fuel cell system having a redundant voltage monitoring system for monitoring the voltage which is present on a fuel cell unit, and a method for voltage monitoring.

9 Claims, 1 Drawing Sheet

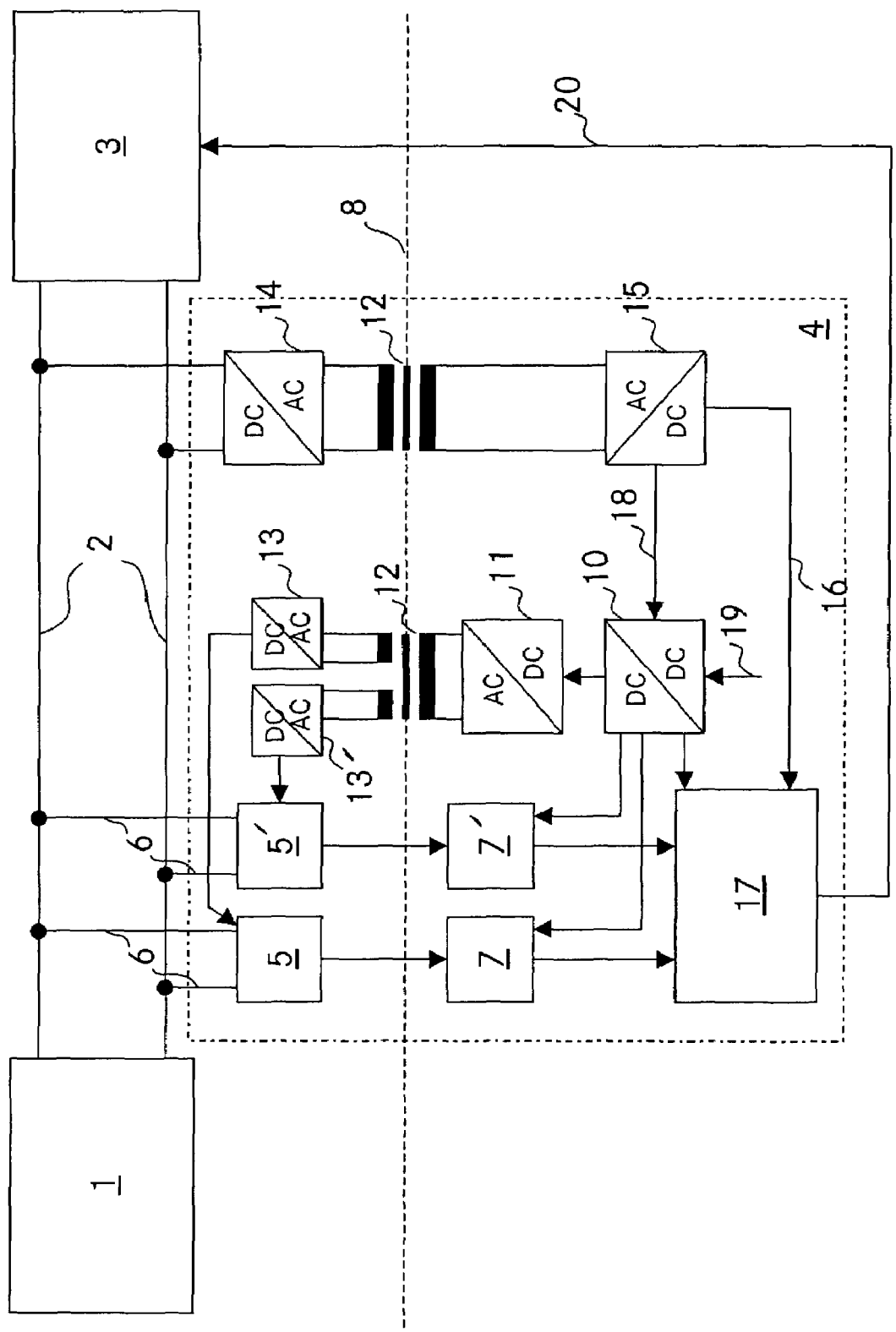

FUEL CELL SYSTEM AND METHOD FOR VOLTAGE MONITORING FOR A FUEL CELL SYSTEM

BACKGROUND AND SUMMARY OF THE INVENTION

This application claims the priority of German Patent Document No. 102 18 669.3-45, filed Apr. 26, 2002, the disclosure of which is expressly incorporated by reference herein.

The invention relates to a fuel cell system having a fuel cell unit, and to a method for voltage monitoring for a fuel cell system having a fuel cell unit.

Germany Patent DE 198 27 880 C1 discloses a circuit device for a fuel cell unit, by means of which the individual fuel cells can be bridged in the form of a low-impedance parallel circuit. Furthermore, a method for operating such a circuit arrangement is disclosed, with the fuel cells being bridged when the magnitude of their voltage falls below a specific threshold value, or when the mathematical sign of their voltage has changed from that during normal operation, or else when the overall fuel cell system is intended to be discharged.

A method for monitoring one or more cells in a fuel cell unit is known from the generic German Patent DE 100 55 291 A1. The monitored voltage is compared with a first and a second preselected voltage value as a function of the load, an electrical component, with the second preselected value being less than the first preselected value. If one of the preselected values is undershot or if a low-voltage event is detected, then an adjusting action is initiated. When an adjusting action is initiated, an external load is reduced, or the supply of power to the external load is ended.

During normal operation, a fuel cell unit is a pure electrical power generator, and not an electrical power load. However, if the current flow direction were to change with electrical current flowing into the fuel cell unit, for example due to faulty operation, then this can lead to damage, or in the extreme even to destruction, of the fuel cell unit. Faulty operation such as this occurs, for example, when a voltage which is greater than the no-load voltage of the fuel cell unit is applied to the output terminals of the fuel cell unit.

The no-load voltage is generally defined as the voltage which is present on the fuel cell unit when the entire fuel cell system is in the no-load mode. The no-load mode is defined such that the fuel cell system is in a state in which it is not emitting any current. If the fuel cell system is used in an electrically powered vehicle, then neither the electrical traction motor for driving the vehicle nor any energy store, which can normally be used as a hybrid energy store and thus as a second power supply unit in addition to the fuel cell system, is supplied with current from the fuel cell unit when in the no-load mode. In consequence, by way of example, in the no-load mode, the electrical traction motor for the vehicle typically does not emit any mechanical drive power to the driven wheels of the vehicle, unless this is alternatively supplied from a battery.

In order to avoid faulty operation and damage to the fuel cell unit, it is therefore necessary to ensure that no current flows into the fuel cell unit from electrical components which are connected to the fuel cell unit and can be operated in a generator mode, that is to say which can generate and/or emit electrical power. This is normally ensured by arranging a diode in the cables, which connects the fuel cell unit to the corresponding electrical components.

One object of the invention is to provide an improved fuel cell system for maintaining the intactness and serviceability of the fuel cell unit of the fuel cell system, and a method for operating the fuel cell system according to the invention.

The fuel cell system according to the invention has a voltage monitoring unit of a redundant configuration and which contains at least two voltage monitoring units. The advantage of a redundant voltage monitoring system is its robustness against faults. If one of the voltage monitoring units is operating incorrectly, then it is possible to make use of the other voltage monitoring unit. A further advantage is that the voltage monitoring units themselves diagnose faulty behaviour in one another by continuously comparing voltage actual values, in particular measured values and/or estimated values.

Furthermore, there is no need for a diode, as is normally provided in the cables which connect the fuel cell unit to the corresponding electrical components, in order to prevent any current from flowing into the fuel cell unit. This leads to a relatively large amount of weight being saved since this type of diode normally has a, precharging apparatus, cooling and a housing, which weighs several kilograms. Furthermore, without the diode there is a reduction in the required space.

Other objects, advantages and novel features of the present invention will become apparent from the following detailed description of the invention when considered in conjunction with the accompanying drawings.

BRIEF DESCRIPTION OF THE DRAWING

The single FIGURE is a schematic illustration of a fuel cell system according to the invention with an outline circuit of a voltage monitoring system.

DETAILED DESCRIPTION OF THE PREFERRED EMBODIMENT

The single FIGURE shows a fuel cell system having a fuel cell unit 1, with an electrical component 3 being connected via cables or the circuit 2 to outputs, which are not shown in any more detail, of the fuel cell unit 1. One of the cables 2 is normally at a high potential, while the other of the cables 2 is at a potential that is lower than the high potential. The cables 2 are preferably high-voltage or medium-voltage cables. The fuel cell unit 1 is composed of one or more series-connected fuel cells. The taps or outputs, which are not identified in any more detail, and which are connected to cables 2 may be located between individual cells, or at the input of a first cell and at the output of a last cell. That is, the voltage is tapped off across all the series-connected and/or parallel-connected fuel cells.

The electrical component 3 is preferably operated at high voltage or medium voltage. In normal use of the terminology, the voltage which the fuel cell unit 1 supplies is referred to as a high voltage or medium voltage. The electrical component 3 is, for example, an electrical converter, a bidirectional DC/DC converter, or an electrical machine which is preferably connected via a converter and is used, for example, as an electrical traction motor for a vehicle.

The electrical component 3, which can also feed power into the high-voltage or medium-voltage network through the cables 2, has a redundant associated voltage monitoring system 4. The voltage monitoring system 4 has a first voltage monitoring unit, which is not identified in any more detail, and a second voltage monitoring unit, which is not identified in any more detail, with the first and/or the second voltage monitoring units having converters and measurement electronics and/or sensors.

The first voltage monitoring unit, which is not identified in any more detail, has first and second measurement electronics 5,5', which are connected via cables 6 to the cables 2, and are connected in parallel with the electrical component 3. Furthermore, a first and a second AC/DC converter or rectifier 13,13', a DC/AC converter, or inverter, 11 and a DC/DC converter 10 are preferably provided, for supplying power to the measurement electronics 5 via cables which are not identified in any more detail. The first AC/DC converter, or rectifier, 13 is associated with the first measurement electronics 5,5', and the second AC/DC converter, or rectifier, 13' is associated with the second measurement electronics 5'.

The measurement electronics 5,5' and hence the first voltage monitoring unit thus have a redundant configuration. If a first measurement electronics device 5 fails, the voltage actual values from the second measurement electronics 5' can be used for voltage monitoring.

The determined voltage actual value may be used not only for voltage monitoring but also for any regulation/control of the electrical component 3. Should the measurement electronics 5,5' not have any suitable sensors for measuring the voltage values, or if no appropriate measurement electronics are provided, then voltage actual values can be determined or estimated from other state variables by means of a so-called observer. Voltage actual values can thus be determined by measurement (measured values) and/or by estimation (estimated values).

A DC/AC converter, or inverter, 14 and a AC/DC converter, or rectifier, 15 are preferably provided for the second voltage monitoring unit, which is not identified in any more detail. This second voltage monitoring unit is used for monitoring the serviceability of the single components, or non-redundant components, of the first voltage monitoring unit, in particular for monitoring the operation of the DC/AC converter, or inverter, 11. The AC/DC converter, or rectifier, 15 and/or the DC/AC converter, or inverter, 14 contains/contain means for determining a voltage which is present in the cables 2, for producing a voltage signal and for transmitting this voltage signal via a cable 16 to a control and/or evaluation unit 17. The profile or the value of this voltage signal depends on the voltage which is present on the cables 2, and is preferably 0 V when no voltage is applied, and assumes a value of more than 0 V when a voltage is applied to the circuit, or to the cables 2. This voltage signal is also referred to as a HV-active signal (voltage active) in the following text.

In order to ensure the safety of users and servicing, repair and maintenance personnel, DC isolation 12 is provided from the high-voltage or medium-voltage area and low-voltage area of the fuel cell system. The dashed line 8 symbolizes this DC isolation. DC isolation 12 is preferably provided by means of a transformer. The DC/AC converter, or inverter, 14 is connected to the AC/DC converter, or rectifier, 15 via cables which are not identified in any more detail but which have DC isolation. In a corresponding manner, the AC/DC converters, or rectifiers, 13,13' are connected to the DC/AC converter, or inverter, 11 via cables which are not identified in any more detail but have DC isolation. The first and the second AC/DC converter, or rectifiers, 13,13' are connected in parallel with one another.

The measurement electronics 5,5' preferably have associated means for DC isolation, preferably optocouplers 7,7', or the measurement electronics 5,5' are connected via cables which are not identified in any more detail to optocouplers or means for DC isolation 7,7'. The means for DC isolation are referred to for the sake of simplicity in general as optocouplers 7,7' in the rest of this text. The voltage actual value determined by the measurement electronics 5,5' are transmitted via the optocouplers 7,7' and via cables, which are not identified in any more detail, to the control and/or evaluation unit 17. The control and/or evaluation unit 17 may contain analogue/digital converters, which are not shown but which convert the analogue signals transmitted from the measurement electronics 5,5' or from the optocouplers 7,7' to digital signals. The control and/or evaluation unit 17 contains means, in particular storage modules, in which algorithms such as regulation and/or evaluation algorithms are stored, which compare the voltage actual values with corresponding preselected limit values, preferably the no-load voltage of the fuel cell unit 1, and detect when these limit values are exceeded. The control and/or evaluation unit 17 is preferably connected to the electrical component 3 via a cable 20, which may be used for transmitting a regulation and/or control signal.

The DC/AC converter, or inverter, 11, the components 13,13', 5,5' and 7,7' connected downstream and the control and/or evaluation unit 17 are preferably supplied with an appropriate voltage, which is preferably 5 V, from a DC/DC converter 10. In the case of an inactive fuel cell unit 1, the DC/DC converter 10 is itself supplied with voltage and/or current from a low-voltage circuit 19, which contains a further current or voltage source, in particular an energy store. If the fuel cell system according to the invention is used in a vehicle, then the voltage or current supply for the DC/DC converter 10 may preferably be produced by a vehicle power supply system. In the case of an active fuel cell unit 1, the current or voltage supply is preferably provided via the DC/AC converter, or inverter, 14, the AC/DC converter, or rectifier, 15 which is connected downstream from it, and the cables 18, at a voltage level of 15 V. Once the fuel cell unit 1 has been switched off, capacitances which may possibly be connected to the cables 2 may be discharged on this path via the DC/AC converter, or inverter, 14, the AC/DC converter, or rectifier, 15, cables which are not shown and an internal voltage supply for the control and/or evaluation unit 17, and/or another control and/or evaluation unit which is connected to the converter 15, but is not shown. The discharging process preferably takes place within 60 seconds to less than 50 V.

The voltage which is present on the electrical component 3 is monitored such that a first voltage actual value and a second, redundant voltage actual value are produced. The voltage actual values are also referred to in the following text as actual values. In the fuel cell system according to the invention, the first actual value is determined by means of the first measurement electronics 5, and the second actual value is determined by means of the second measurement electronics 5'. In addition, the DC/AC converter, or inverter, 14 and/or the AC/DC converter, or rectifier, 15 produce/produces a further voltage signal, a so-called HV-active signal, when a voltage is present on the cables 2 and is transmitted via the cable 16 to the control and/or evaluation unit 17. Determining the HV-active signal makes it possible to check the operation of the non-redundant DC/AC converter, or inverter, 11. If no measurement electronics 5,5' are provided or if it is intended to save voltage sensors, then the actual values may also be determined with the aid of observers, for example a so-called Luenberger observer (see "Regelungstechnik" [Control Engineering], Otto Föllinger, 7th Edition, Hüthig Verlag). In this case, the voltage actual values are determined or estimated (estimated value) from other available state variables for the fuel cell system.

The first actual value is compared with the first preselected limit value, and/or the second actual value is compared with the second preselected limit value. The limit values preferably correspond to the no-load voltage of the fuel cell unit 1, but may also be preselected in a different manner. The first and the second actual value may both be measured values, both be estimated values, or one of the two actual values may be an estimated value, with the other actual value being a measured value.

If, for example, the electrical load 3 is a DC/DC converter with a normal operating or control range up to a maximum of 425 V±2% and if the aim is for not more than 450 V to be present on the fuel cell unit 1 on the cables 2, in order to avoid damage to the fuel cell unit 1, and if the DC/DC converter may have a maximum voltage overshot of 5 V when the maximum power level is being emitted and sudden load shedding occurs, then the first limit value for the first actual value is preferably 425 V±2%, and the second limit value for the second actual value is preferably 440 V±1%.

If the first actual value exceeds the first limit value, then a fault signal is produced and/or the electrical component 3 is switched off. The fault signal and/or the switching-off process may preferably be initiated by the control and/or evaluation unit 17. In order to switch off the electrical component 3, the control and/or evaluation unit 17 transmits an appropriate control signal to the electrical component 3, preferably via the cable 20.

If the second actual value exceeds the second limit value, then a fault signal is produced and/or the electrical component 3 is switched off. In order to switch off the electrical component 3, the control and/or evaluation unit 17 preferably transmits an appropriate control signal via the cable 20 to the electrical component 3.

The measurement electronics 5,5' have a redundant configuration, each having a AC/DC converter, or rectifier, 13,13' and, preferably, an optocoupler 7,7'. If one component fails in a first measurement group comprising an AC/DC converter, or rectifier, 13,13', measurement electronics 5,5' connected downstream from it, and a component 7,7' connected downstream from it, for example the measurement electronics 5,5' then the actual value which is determined by the second measurement group, which is formed in the same way, is used for voltage monitoring, and vice versa. Failure of a component can preferably be determined by comparing the first actual value, as determined by the first measurement electronics 5', with the second actual value, as determined by the second measurement electronics 5', preferably by means of the control and/or evaluation unit 17.

In order to ensure correct voltage determination, the first actual value is thus compared with the second actual value, preferably continuously or virtually continuously, and a comparison value is formed. If this comparison value, preferably the magnitude of this comparison value, exceeds a third preselected limit value, then at least one component 5, 7, 13 of the first measurement group or at least one component of the second measurement group is faulty.

In addition, an HV-active signal is produced by the DC/AC converter, or inverter, 14 and/or by the AC/DC converter, or rectifier, 15 when a voltage is applied to the cables or to the circuit 2, and this HV-active signal is transmitted via the cable 17 to the control and/or evaluation unit 17. If the DC/AC converter, or inverter, 11, now fails owing to a fault or a malfunction, and the measurement electronics 5,5' and the AC/DC converters, or rectifiers, 13 are in consequence not supplied with electrical power, then no, or incorrect, first and second voltage actual values, in particular 0 V, are sensed by the two measurement electronics devices 5,5'. The control and/or evaluation unit 17 identifies the failure of the DC/AC converter, or inverter, 11 and/or of both measurement groups in each case comprising the components 5,5', 7,7', 13,13' by comparing the voltage actual values which have not been determined, or have been determined incorrectly, with the HV-active signal. If the control and/or evaluation unit 17 identifies the failure of the first voltage monitoring unit, then it produces a fault signal and/or switches off the electrical component 3. In order to switch off the electrical component 3, the control and/or evaluation unit 17 transmits an appropriate control signal to the electrical component 3, preferably via the cable 20.

The comparison of actual values with one another and with the corresponding limit values, and the evaluation and the comparison of the HV-active signal are expediently carried out in the form of an algorithm by software, which is stored in the control and/or evaluation unit 17, or in another control and/or evaluation unit. The comparisons and evaluations may, however, also be carried out by means of hardware in the form of appropriate electronic circuits.

The fuel cell system according to the invention and the method according to the invention are preferably used in a vehicle which has a fuel cell system that supplies electrical power to a traction motor for the driven wheels of the vehicle. The traction motor may also be used as a generator, for example for supplying a vehicle power supply system, by converting braking energy into electrical energy.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for voltage monitoring for a fuel cell system having a fuel cell unit, with the fuel cell unit being connected via cables to an electrical component, said method comprising the steps:
    detecting presence of a voltage on the electrical component;
    producing, from a first voltage monitoring unit and a second voltage monitoring unit, respectively, a first actual value and a second, redundant actual value from the detected voltage which is present on the electrical component;
    comparing at least one of the first actual value with a first limit value, and the second actual value with a second limit value; and
    based on a result of said comparing, determining whether the first limit value or the second limit value is exceeded.

2. The method according to claim 1, wherein the first actual value is compared with the second actual value, and a comparison value is formed.

3. The method according to claim 1, wherein at least one of a fault signal is produced and the electrical component is switched off if the first limit value is exceeded.

4. The method according to claim 1, wherein at least one of a fault signal is produced and the electrical component is switched off if the second limit value is exceeded.

5. The method according to claim 2, wherein, if the comparison value exceeds a third limit value, at least one of the following is true: i) a fault signal is produced, and ii) the electrical component is switched off.

6. The method according to claim 1, wherein at least one of the first limit value and the second limit value is equal to the no-load voltage of the fuel cell unit.

7. The method according to claim 1, wherein the second limit value is higher than the first limit value.

8. The method according to claim 1, wherein an additional voltage signal is produced when a voltage is present on the cables.

9. The method according to claim 8, wherein the additional voltage signal is compared with at least one of the first and the second actual value.

* * * * *